(12) United States Patent
Hudait et al.

(10) Patent No.: US 8,143,646 B2
(45) Date of Patent: Mar. 27, 2012

(54) STACKING FAULT AND TWIN BLOCKING BARRIER FOR INTEGRATING III-V ON SI

(75) Inventors: Mantu K. Hudait, Portland, OR (US); Mohamad A. Shaheen, Portland, OR (US); Loren A. Chow, Santa Clarra, CA (US); Peter G. Tolchinsky, Beaverton, OR (US); Joel M. Fastenau, Bethlehem, PA (US); Dmitri Loubychev, Bethlehem, PA (US); Amy W. K. Liu, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 186 days.

(21) Appl. No.: 11/498,901

(22) Filed: Aug. 2, 2006
(Under 37 CFR 1.47)

(65) Prior Publication Data

US 2008/0032478 A1    Feb. 7, 2008

(51) Int. Cl.
*H01L 21/02* (2006.01)

(52) U.S. Cl. ........ 257/190; 257/200; 257/201; 257/615; 257/E21.09; 257/E21.097; 257/E21.098; 257/E21.108; 257/E21.109; 257/E21.115

(58) Field of Classification Search ............... 257/200, 257/201, 615, E31.059, E33.023, E21.097, 257/E21.098, E21.108, E21.109, E21.112, 257/E21.126, E21.127, 190, E21.09
See application file for complete search history.

(56) References Cited

U.S. PATENT DOCUMENTS

| | | | |
|---|---|---|---|
| 4,751,201 A | 6/1988 | Nottenburg et al. | |
| 4,871,692 A | 10/1989 | Lee et al. | |
| 4,872,046 A * | 10/1989 | Morkoc et al. | 257/192 |
| 4,914,059 A | 4/1990 | Nissim et al. | |
| 5,144,378 A | 9/1992 | Hikosaka | |
| 5,357,119 A | 10/1994 | Wang et al. | |
| 5,479,033 A | 12/1995 | Baca et al. | |
| 5,495,115 A | 2/1996 | Kudo et al. | |
| 5,652,454 A | 7/1997 | Iwamatsu et al. | |

(Continued)

FOREIGN PATENT DOCUMENTS

EP    0 265 314 A1    4/1988
(Continued)

OTHER PUBLICATIONS

M Mori et al., Heteroepitaxial growth of InSb films on a Si(001) substrate via AlSb buffer layer, Applied Surface Science 216 (2003) pp. 569-574.

(Continued)

*Primary Examiner* — Jay C Kim
(74) *Attorney, Agent, or Firm* — Blakely, Sokoloff, Taylor & Zafman LLP (57) ABSTRACT

A stacking fault and twin blocking barrier for forming a III-V device layer on a silicon substrate and the method of manufacture is described. Embodiments of the present invention enable III-V InSb device layers with defect densities below $1\times10^8$ cm$^{-2}$ to be formed on silicon substrates. In an embodiment of the present invention, a buffer layer is positioned between a III-V device layer and a silicon substrate to glide dislocations. In an embodiment of the present invention, GaSb buffer layer is selected on the basis of lattice constant, band gap, and melting point to prevent many lattice defects from propagating out of the buffer into the III-V device layer. In a specific embodiment, a III-V InSb device layer is formed directly on the GaSb buffer.

16 Claims, 9 Drawing Sheets

U.S. PATENT DOCUMENTS

| | | | |
|---|---|---|---|
| 5,883,564 A * | 3/1999 | Partin | 338/32 R |
| 5,981,400 A * | 11/1999 | Lo | 438/745 |
| 6,031,249 A | 2/2000 | Yamazaki et al. | |
| 6,117,697 A * | 9/2000 | Seaford et al. | 438/19 |
| 6,133,593 A | 10/2000 | Boos et al. | |
| 6,150,222 A | 11/2000 | Gardner et al. | |
| 6,190,975 B1 | 2/2001 | Kubo et al. | |
| 6,252,262 B1 | 6/2001 | Jonker et al. | |
| 6,310,367 B1 | 10/2001 | Yagishita et al. | |
| 6,320,212 B1 | 11/2001 | Chow | |
| 6,399,970 B2 | 6/2002 | Kubo et al. | |
| 6,403,434 B1 | 6/2002 | Yu | |
| 6,406,795 B1 * | 6/2002 | Hwang et al. | 428/457 |
| 6,407,442 B2 | 6/2002 | Inoue et al. | |
| 6,458,662 B1 | 10/2002 | Yu | |
| 6,607,948 B1 | 8/2003 | Sugiyama | |
| 6,686,231 B1 | 2/2004 | Ahmed et al. | |
| 6,762,469 B2 | 7/2004 | Mocuta et al. | |
| 7,154,118 B2 | 12/2006 | Lindert | |
| 7,202,503 B2 * | 4/2007 | Chow et al. | 257/78 |
| 7,235,822 B2 | 6/2007 | Li | |
| 7,485,503 B2 | 2/2009 | Brask et al. | |
| 7,573,059 B2 | 8/2009 | Hudait et al. | |
| 2002/0093332 A1 * | 7/2002 | Schroeder et al. | 324/251 |
| 2002/0096724 A1 | 7/2002 | Liang et al. | |
| 2002/0160553 A1 | 10/2002 | Yamanaka et al. | |
| 2002/0185655 A1 | 12/2002 | Fahimulla et al. | |
| 2003/0057477 A1 | 3/2003 | Hergenrother et al. | |
| 2003/0080332 A1 | 5/2003 | Phillips | |
| 2003/0227036 A1 | 12/2003 | Sugiyama | |
| 2004/0031979 A1 | 2/2004 | Lochtefeld et al. | |
| 2004/0075149 A1 | 4/2004 | Fitzgerald et al. | |
| 2004/0099966 A1 | 5/2004 | Chau et al. | |
| 2004/0219722 A1 | 11/2004 | Pham et al. | |
| 2004/0227187 A1 | 11/2004 | Cheng et al. | |
| 2005/0040429 A1 | 2/2005 | Uppal | |
| 2005/0062082 A1 | 3/2005 | Bucher et al. | |
| 2005/0145944 A1 | 7/2005 | Murthy et al. | |
| 2005/0224800 A1 | 10/2005 | Lindert et al. | |
| 2005/0287752 A1 | 12/2005 | Nouri et al. | |
| 2006/0148182 A1 | 7/2006 | Datta et al. | |
| 2006/0172480 A1 | 8/2006 | Wang et al. | |
| 2007/0001219 A1 | 1/2007 | Radosavljevic et al. | |
| 2007/0069302 A1 | 3/2007 | Jin | |
| 2007/0090416 A1 | 4/2007 | Doyle | |
| 2008/0032478 A1 | 2/2008 | Hudait et al. | |

FOREIGN PATENT DOCUMENTS

| | | |
|---|---|---|
| EP | 0 469 604 A2 | 2/1992 |
| EP | 0 474 952 A1 | 3/1992 |
| JP | 5-90252 | 4/1993 |
| JP | 06 132521 | 5/1994 |
| JP | 2005085916 A | 3/2005 |
| WO | WO 91/06976 | 5/1991 |

OTHER PUBLICATIONS

A. Wan et al., Characterization of GaAs grown by Molecular Beam Epitaxy on Vicinal Ge (100) Substrates. J. Vac. Sci. Technol. B 22(4) Jul./Aug. 2004, pp. 1893-1897.

R.M. Sieg et al., Toward device-quality GaAs Growth by Molecular Beam Epitaxy on Offcut Ge/SiGe/Si substrates, J. Vac. Sci. Technol. B 16(3), May/Jun. 1998, pp. 1471-1474.

S. Scholz et al., MOVPE Growth of GaAs on Ge Substrates by Inserting a Thin Low Temperature Buffer Layer, Cryst. Res. Technol. 41, No. 2 (2006), pp. 111-116.

M. Doczy et al., US Patent Application, Extreme High Mobility CMOS Logic, U.S. Appl. No. 11/305,452, Dec. 15, 2005.

Akaha et al., JP2005-85916, Mar. 31, 2005, Machine translation in English, 11 pages.

Balakrishnan et al., "Room-temperature optically-pumped GaSb quantum well based VCSEL monolithically grown on Si (100) substrate," Electronic Letters, vol. 42, No. 6, Mar. 16, 2006, 2 pages.

Intel Corporation Office Action for U.S. Appl. No. 11/501,253 mailed May 14, 2008.

Intel Corporation Office Action for U.S. Appl. No. 11/501,253 mailed Dec. 12, 2008.

Intel Corporation Notice of Allowance for U.S. Appl. No. 11/501,253 mailed Apr. 7, 2009.

Intel Corporation Office Action for U.S. Appl. No. 11/498,685 mailed Nov. 24, 2009.

Nguyen et al., "Growth of heteroepitaxial GaSb thn films on Si (100) substrates," Journal of Materials Research, vol. 19, No. 8, Aug. 2004, pp. 2315-2321.

Uchida et al., "Reduction of dislocation density by thermal annealing for GaAs/GaSb/Si heterostructure," Journal of Crystal Growth, 150, 1995, pp. 681-684.

Intel Corporation Office Action for U.S. Appl. No. 11/498,685 mailed May 26, 2010.

Intel Corporation Notice of Allowance for U.S. Appl. No. 11/498,685 mailed Aug. 6, 2010.

T. Ashley et al., "High-Speed, Low-Pressure InSb Transistors", 1997 IEEE, IEDM 97-751, pp. 30.4.1-30.4.4.

Ashley et al. "InSb-Based Quantum Well Transistors for High Speed, Low Power Applications", QinetiQ, Malvern Technology Center and Intel (2004), 2 pages.

G. Balakrishnan et al., "Room-Temperature Optically-Pumped GaSb Quantum Well Based VCSEL Monolithically Grown on Si (100) Substrate", Electronic Letters Mar. 16, 2006, vol. 42, No. 6, 2 pages.

Bednyi et al. "Electronic State of the Surface of INP Modified by Treatment in Sulfur Vapor" Soviet Physics Semiconductors, Am. Inst. of Physics, New York, vol. 26, No. 8, Aug. 1, 1992.

V.N. Bessolov et al., "Chalcogenide Passivation of III-V Semiconductor Surfaces", 1998 American Institute of Physics, Semiconductors 32 (11), Nov. 1998.

Buchanan, D.A. "Fabrication of Midgap Metal Gates Compatible with Ultrathin Dielectrics", Applied Physics Letters 73.12 (1998), pp. 1676-1678.

Chau, R., "Advanced Metal Gate/High-K Dielectric Stacks for High-Performance CMOS Transistors", Proceedings of AVS 5th International Conference of Microelectronics and Interfaces, Mar. 2004, (3 pgs.).

Claflin, B. "Interface Studies of Tungsten Nitride and Titanium Nitride Composite Metal Gate Electrodes with Thin Dielectric Layers", Journal of Vacuum Science and Technology, A 16.3 (1998), pp. 1757-1761.

Datta et al. "85mm Gate Length Enhancement and Depletion Mode InSb Quantum Well Transistors for Ultra High Speed and Very Low Power Digital Logic Applications" IEEE Dec. 5, 2005, pp. 763-766.

Datta, et al., U.S. Appl. No. "Extreme High Mobility CMOS Logic" U.S. Appl. No. 11/305,452, filed Dec. 15, 2005.

Frank et al., HfO2 and Al2O3 Dielectrics GaAs Grown by Atomic Layer Deposition, Applied Physics Letters, vol. 86, Issue 15, id. 152904, 2005, 1 page.

Gonzalez et al., "Selenium Passivation of GaAs(001): A Combined Experimental and Theoretical Study", Institute of Physics Publishing, Journal of Physics Condensed Matter, J. Phys.: Condens. Matter 16 (2004), pp. 2187-2206.

Hwang, Jeong-Mo, "Novel Polysilicon/TiN Stacked Gate Structure for Fully Depleted SOI/CMOS", International Electronic Devices Meeting Technical Digest (1992), pp. 345-348.

H.W. Jang et al. "Incorporation of Oxygen Donors in AlGaN", J. Electronchem Soc. 152, pp. G536-G540, (2004).

Jin, B. et al., "Mobility Enhancement in Compressively Strained SIGE Surface Channel PMOS Transistors with HF02/TIN Gate Stack", Proceedings of the First Joint International Symposium, 206th Meeting of Electrochemical Society, Oct. 2004, pp. 111-122.

B.A. Kuruvilla et al., "Passivation of GaAs (100) using Selenium Sulfide", 1993 American Institute of Physics, J. Appl. Phys. 73 (9), May 1, 1993, pp. 4384-4387.

D. Mistele et al., "Incorporation of Dielectric Layers into the Processing of III-Nitride-Based Heterostructure Field-Effect Transistors", Journal of Electronic Materials, vol. 32, No. 5, 2003, pp. 355-363.

M. Mori et al., "Heteroepitaxial Growth of InSb films on a Si(001) Substrate via AlSb Buffer Layer", Applied Surface Science 216 (2003), pp. 569-574.

Nowak, Edward J. et al., "Turning Silicon On Its Edge," IEEE Circuits & Devices Magazine, vol. 1, (Jan./Feb. 2004), pp. 20-31.

K.Y. Park et al., "Device Charateristics of AlGaN/GaN MIS-HFET Using Al2O3-HfO2 Laminated High-k Dielectric", Japanese Journal of Applied Physics, vol. 43, No. 11A, 2004, pp. L1433-L1435.

Passlack et al., "Self-Aligned GaAs p-Channel Enhancement Mode MOS Heterostructure Field-Effect Transistor", IEEE Electron Device Letters, vol. 23, No. 9, Sep. 2002, pp. 508-510.

PCT Search Report PCT/US2006/044601, Mar. 19, 2007, 7 pages.

Scholz et al., "MOVPE Growth of GaAs on Ge Substrates by Inserting a Thin Low Temperature Buffer Layer", Cryst. Res. Technol. 41, No. 2 (2006), pp. 111-116.

R.M. Sieg et al., "Toward Device-Quality GaAs Growth by Molecular Beam Epitaxy on Offcut Ge/SiGe/Si Substrates", J. Vac. Sci. Technol. B 16(3) May/Jun. 1998, pp. 1471-1474.

T. Sugizaki et al., "Novel Multi-bit SONOS Type Flash Memory Using a High-k Charge Trapping Layer" 2003 Symposium on VLSI Technology Digest of Technical Papers, pp. 27-28.

A. Wan et al., "Characterization of GaAs Grown by Molecular Beam Epitaxy on Vicinal Ge (100) Substrates", J. Vac. Sci. Technol. B 22(4) Jul./Aug. 2004, pp. 1893-1897.

Ashley, et al., "Novel InSb-based Quantum Well Transistors for Ultra-High Speed, Low Power Logic Applications," Solid-State and Integrated Circuits Technology, 7th International Conference on, Beijing 2004, IEEE vol. 3, 4 Pages.

* cited by examiner

STACKING FAULT AND TWIN BLOCKING BARRIER FOR INTEGRATING III-V ON SI

BACKGROUND OF THE INVENTION

1. Field of the Invention

The present invention relates to integrating III-V semiconductor devices upon silicon substrates. More particularly this invention relates to the buffer layer between a III-V semiconductor device and a silicon substrate.

2. Discussion of Related Art

A variety of electronic and optoelectronic devices can be enabled by developing thin film relaxed lattice constant III-V semiconductors on elemental silicon (Si) substrates. Surface layers capable of achieving the performance advantages of III-V materials may host a variety of high performance electronic devices such as CMOS and quantum well (QW) transistors fabricated from extreme high mobility materials such as, but not limited to, indium antimonide (InSb), indium gallium arsenide (InxGa1-xAs) (x >0.53) and indium arsenide (InAs). Optical devices such as lasers, detectors and photovoltaics may also be fabricated from various other direct band gap materials, such as, but not limited to, gallium arsenide (GaAs) and indium gallium arsenide (InGaAs). These devices can be further enhanced by monolithically integrating them with conventional devices of silicon and use of a silicon substrate has the additional advantage of cost reduction.

Despite all these advantages, the growth of III-V materials upon silicon substrates presents many challenges. Crystal defects are generated by lattice mismatch, polar-on-nonpolar mismatch and thermal mismatch between the III-V semiconductor epitaxial layer and the silicon semiconductor substrate. When the lattice mismatch between the epitaxial layer and substrate exceeds a few percent, the strain induced by the mismatch becomes too great and defects are generated in the epitaxial layer when the epitaxial film relaxes. Once the film thickness is greater than the critical thickness (film is strained below this thickness and relaxed above this thickness), the strain is relaxed by creating misfit dislocations at the film and substrate interface as well as in the epitaxial film. The epitaxial crystal defects are typically in the form of threading dislocations, stacking faults and twins (periodicity breaks where one portion of the lattice is a mirror image of another). Many defects, particularly threading dislocations, tend to propagate into the "device layer" where the semiconductor device is fabricated. Generally, the severity of defect generation correlates to the amount of lattice mismatch between the III-V semiconductor and the silicon substrate. For these reasons, the large lattice mismatch (approximately 19.2% between the exemplary indium antimonide (InSb) and silicon (Si) combination) typically results in an epitaxial device layer having a high defect density, on the order of $1 \times 10^9$ cm$^{-2}$ to $1 \times 10$ cm$^{-2}$. The high defect density reduces the carrier mobility theoretically possible in bulk InSb, eliminating many of the technical advantages of "InSb-on-silicon" integration. For example, the electron mobility in bulk InSb films is estimated to be approximately 76,000 cm$^2$/Vs. However, to date, the best reported electron mobility of an InSb film formed over a silicon substrate is significantly lower, approximately 40,000-50,000 cm$^2$/Vs.

Similarly, a high defect density is also detrimental to photonic devices formed in or upon III-V semiconductor device layers on silicon substrates. The recombination-generation (R-G) energies of crystal defects are typically mid-gap, detracting from the performance of a semiconductor device layer that has been band gap engineered for a particular optical wavelength.

Figure 1A:
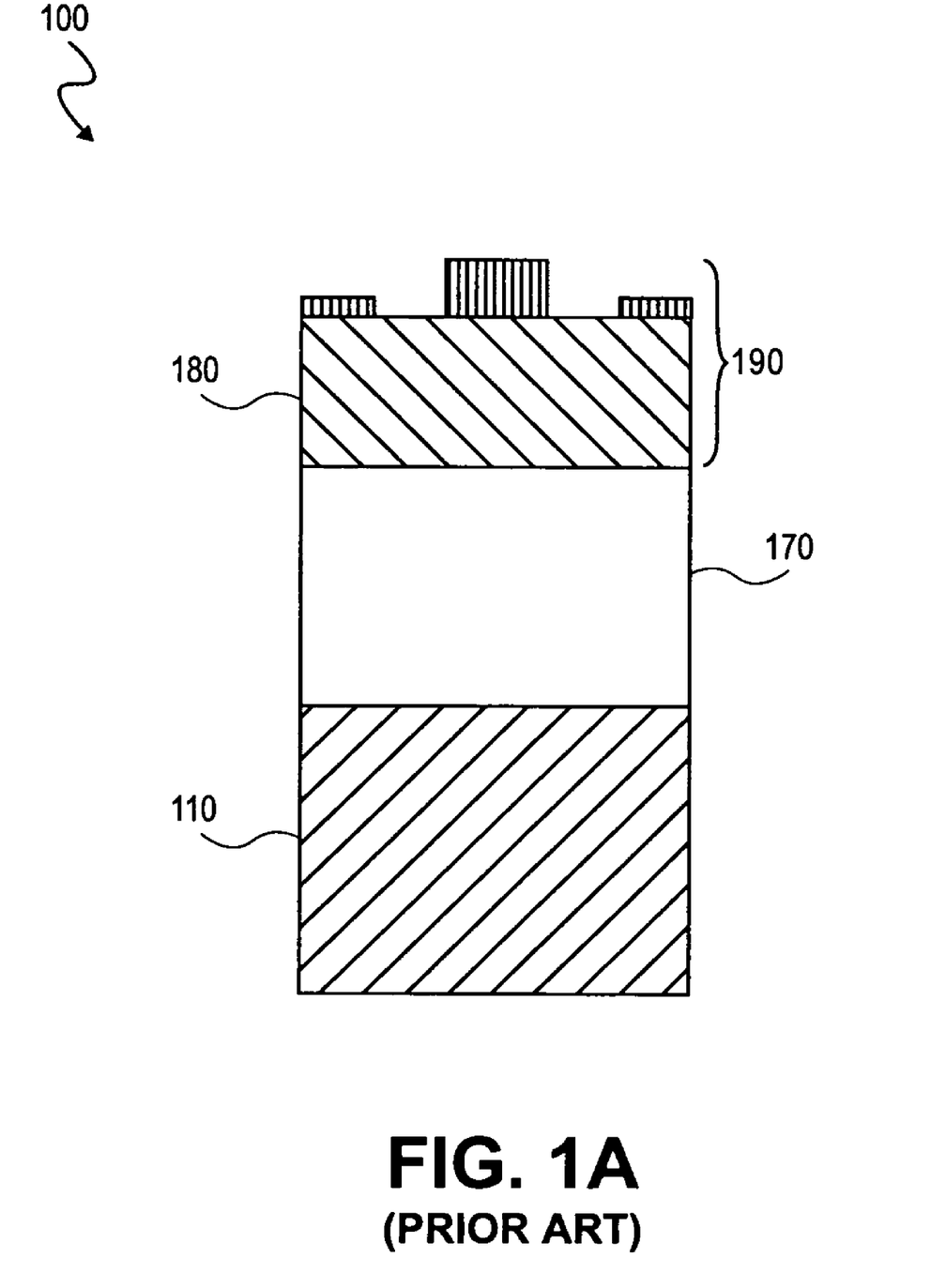
FIG. 1A is an illustration of a cross-sectional view of a conventional group III-V semiconductor device formed upon a silicon substrate.
Figure 1B:
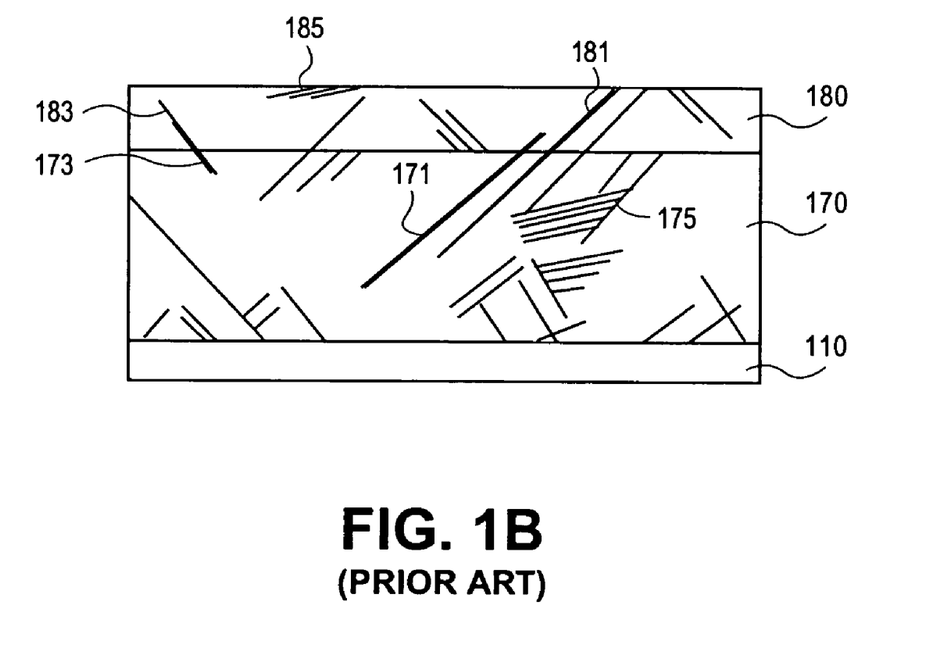
FIG. 1B is an illustration of a cross-sectional view of a conventional group III-V semiconductor device layer formed upon a silicon substrate.

Various buffer layers have been used in attempts to relieve the strain induced by the lattice mismatch between the silicon substrate and the III-V device layer and thereby reduce the detrimental defect density of the device layer. For example, as shown in apparatus 100 of FIG. 1A, a material forms a buffer layer 170 between a silicon substrate 110 and a III-V device layer 180. A semiconductor device 190 is then fabricated in or upon device layer 180. Various materials have been utilized as the buffer layer 170. For example, an aluminum antimonide (AlSb) buffer layer 170 has been attempted as has a strontium titanate (SrTiO$_3$) buffer layer 170 between a silicon substrate 110 and a III-V device layer 180. In practice however, as depicted in FIG. 1B, these buffer layers are unable to prevent twins 171, threading dislocations 173 and stacking faults 175 from propagating into the III-V device layer 180 as twins 181, threading dislocations 183, and stacking faults 185. Thus, there remains a need for a buffer layer architecture that enables lower defect density III-V semiconductor device layers formed upon silicon substrates.

DETAILED DESCRIPTION OF THE PRESENT INVENTION

In various embodiments, a stacking fault and twin blocking barrier for integrating III-V semiconductor devices on silicon substrates is described with reference to figures. However, certain embodiments may be practiced without one or more of these specific details, or in combination with other known methods and materials. In the following description, numerous specific details are set forth, such as specific materials, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Figure 2:
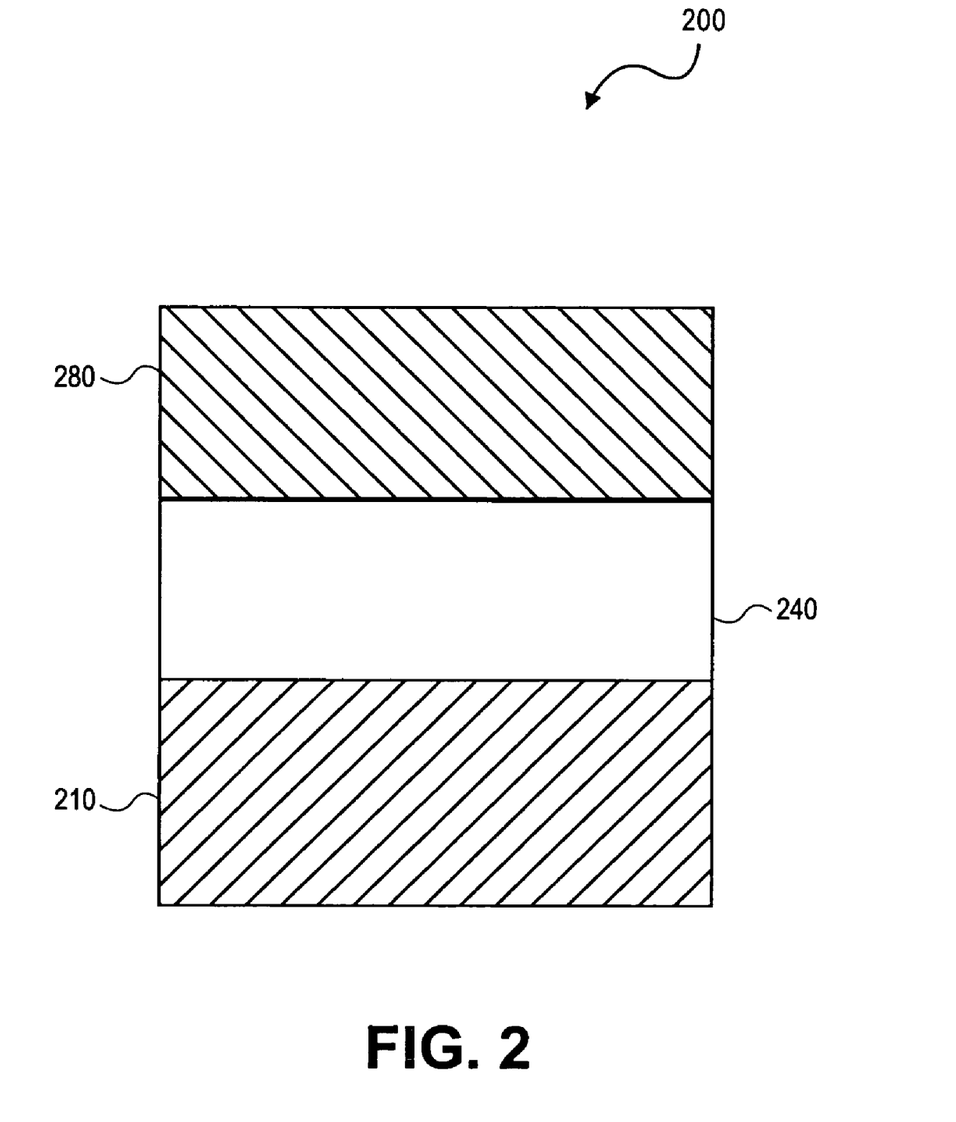
FIG. 2 is an illustration of a cross-sectional view of a group III-V semiconductor device layer formed upon a silicon substrate in accordance with the present invention.

Embodiments of the present invention reduce the dislocations within the III-V device layer formed over a silicon substrate to near bulk-like quality by utilizing a buffer architecture and specific fabrication techniques tailored to the particular III-V device layer desired. As shown in FIG. 2, embodiments of the present invention utilize a III-V semiconductor material buffer layer 240 formed between a silicon substrate 210 and III-V device layer 280 to form a semiconductor stack 200. In embodiments of the present invention, the III-V buffer layer 240 architecture is engineered for a particular III-V device layer material 280 with the materials for the III-V buffer layer 240 selected with consideration of lattice constant, band gap and melting point for the purpose of controlling nucleation and propagation of defects generated by lattice mismatch strain.

In particular embodiments, the III-V buffer layer 240 is formed on a vicinal surface of silicon substrate 210 having regular arrays of double-stepped (100) terraces across the substrate surface. A vicinal surface is a higher order crystal plane of the silicon substrate, such as, but not limited to the (211), (511), (013), (711) planes. A vicinal substrate surface having double-stepped terraces is capable of suppressing anti-phase domains (APD) in the III-V buffer layer 240. An APD is created when a first polar crystal domain of layer 240, having group III atoms attached to the nonpolar silicon substrate surface, meets a second polar crystal domain of layer 240, having group V atoms attached to the silicon substrate. A crystal discontinuity forms in layer 240 at the border between these first and second domains providing recombination-generation centers detrimental to the operation of a semiconductor device. The term "polar" refers to the partially ionic bonding character between the constituents of a III-V compound semiconductor.

Embodiments providing the double atomic step in the silicon substrate 210 provide for a terrace level of sufficient depth to prevent the growth species of buffer layer 240 from bonding to a higher level terrace even after all binding sites in the lowest terrace are occupied. Thus, the double step terrace prevents ad-hoc surface bonding so that the growth of the III-V buffer layer 240 proceeds in a stepwise fashion with each polar group III-V atomic bi-layer sequentially filling the lowest terrace of the nonpolar group IV, silicon substrate. In some embodiments, anti-phase domains are eliminated by growing layer 240 to a thickness greater than approximately 1.5 um. At such thicknesses, anti-phase domains are substantially annihilated and a single domain film can be formed even on first order planes, such as, but not limited to, the (100) silicon substrates commonly used for microelectronic fabrication. In alternative embodiments, a single domain layer 240 is grown such a manner that the formation of anti-phase domains is avoided. In such embodiments layer 240 may not be required to be thick, and may for example, be less than approximately 0.1 um in thickness using offcut Si substrate along with proper growth parameters such as growth rate, growth temperature and starting growth precursors. Additionally, buffer layer 240 grown according to embodiments of this invention may be substantially free of stacking faults and twins. The phrase substantially free of stacking faults and twins as used herein means that stacking fault and twin densities cannot be accurately measured using cross-section TEM or bandwidth TEM because such methods lose resolution below the detectible range of approximately $1 \times 10^7$ cm$^{-2}$.

In a particular embodiment, the III-V buffer layer 240 has a lattice spacing larger than the silicon substrate 210, and the III-V device layer 280 has a lattice spacing larger than the III-V buffer layer 240. In one such an embodiment, buffer 240 is comprised of a gallium antimonide (GaSb) layer 240 formed between the silicon substrate 210 and an indium antimonide (InSb) device layer 280. The 6.09Å lattice constant of GaSb layer 240 is approximately 12.2% larger than the 5.43Å lattice constant of the Silicon substrate 210 upon which layer 240 is formed. The 6.48Å lattice constant of the InSb layer 280 is approximately 6.2% larger than the GaSb layer 240. Thus, in this particular embodiment, the lattice constant of the buffer 240 incremented the lattice spacing of the silicon substrate 210 to the lattice spacing of the III-V device layer 280, thereby partitioning the total lattice mismatch between two separate material interfaces. In this manner, the InSb device layer 280 need only accommodate the strain of a 6.2% lattice mismatch with GaSb layer 240 rather than the entire 19.2% mismatch with the silicon substrate 210.

It should be appreciated that various III-V device layers, such as, but not limited to, indium arsenide (InAs) device layers may be similarly integrated with silicon substrates using other buffer embodiments. For example, in another embodiment of the present invention, III-V buffer layer 240 is comprised of a gallium arsenide (GaAs) formed between the silicon substrate 210 and indium arsenide (InAs) device layer 280 to graduate the lattice constant in a manner analogous to that just described for the InSb embodiment.

In embodiments of the present invention, the buffer 240 comprises materials which glide dislocations and terminate a significant percentage of the dislocations within the layer. In particular embodiments, the III-V buffer layer 240 is comprised of a relatively narrow band gap III-V semiconductor material. Generally, the extent of dislocation glide is dependent on the hardness of the material, with glide occurring more readily in softer materials. Semiconductor materials of narrower band gap are typically softer, and it has been found more dislocation glide occurs in narrower band gap materials. Furthermore, more of the dislocations are terminated or contained as the thickness of a material capable of dislocation glides is increased. In one particular embodiment, the III-V buffer layer 240 is GaSb having a thickness between approximately 0.3 um and 5.0 um. GaSb readily glides defects because the band gap of GaSb is relatively narrow, approximately 0.7 eV. Dislocation glide occurring within the GaSb changes the direction a defect propagates. This is particularly true for threading dislocations which typically propagate at an approximate sixty degree angle from the substrate surface. Gliding can change the direction of a threading dislocation to an angle more parallel to the surface of the film to terminate or contain the dislocations within the film as the buffer layer is thickened. For this reason, many of the defects induced by the strain of the 12.2% lattice mismatch between the silicon substrate 210 and a III-V buffer layer 240 of GaSb are glided and contained within the GaSb layer 240. Because many such glided dislocations will not propagate into subsequently grown films, it is therefore possible to avoid simply accumulating defects within the subsequent epitaxial layers.

As previously discussed, the 6.09Å lattice constant of GaSb layer 240 is approximately 12.2% larger than the 5.43Å lattice constant of the Silicon substrate 210 upon which layer 240 is formed. Because the band gap of GaSb is approximately 0.7 eV, the GaSb layer 240 is relatively soft and able to glide dislocations. In the same vein, it should be apparent that an embodiment utilizing GaSb provides better dislocation glide characteristics than an embodiment utilizing GaAs for the III-V buffer layer 240 because band gap of GaSb is lower than GaAs.

In embodiments of the present invention, the III-V buffer layer 240 has a low melting point temperature which improves the thermal activation of dislocation glide within layer 240 during the subsequent layer growth. Dislocation glide reduces the propagation of threading dislocations, stacking faults and twins into the subsequent layers. In a particular embodiment, for example, a III-V buffer layer 240 of GaSb has a melting point of approximately 712 C. In another particular embodiment, the melting point of a GaAs layer 240 is approximately 1237 C. Generally, the lower the melting point of the material, the better the dislocation glide.

In particular embodiments, buffer 240 allows for subsequent growth of a device layer 280 having an acceptably low final defect density. For such embodiments, the buffer 240 accommodates much of the 19.2% lattice mismatch between InSb device layer 280 and silicon substrate 210 to obtain a device layer having a threading dislocation defect density below $1 \times 10^8$ cm$^{-2}$.

In embodiments of the present invention, the III-V device layer 280 of FIG. 2 is of the desired material and of a sufficient thickness to achieve low defect density. Because the lattice spacing of the III-V device layer 280 is considered in the design of the buffer 240, the III-V device layer 280 has significantly less lattice mismatch relative to the buffer 240 than to the silicon substrate 210. A substantial portion of the defects in device layer 280 generated by lattice mismatch strain or propagated from the buffer 240 are glided within III-V device layer 280 as the thickness of 280 is increased. In an embodiment of the present invention the device layer 280 is grown to approximately 2.5 um thick to ensure defect density in the device layer 280 is below $1 \times 10^8$ cm$^{-2}$. In another embodiment the device layer 280 is grown to at least 7.5 um thick. Thus, the present embodiments provide for device-grade InSb on silicon substrates enabling electronic structures such as quantum well transistors to be formed on silicon substrates.

Figure 5:
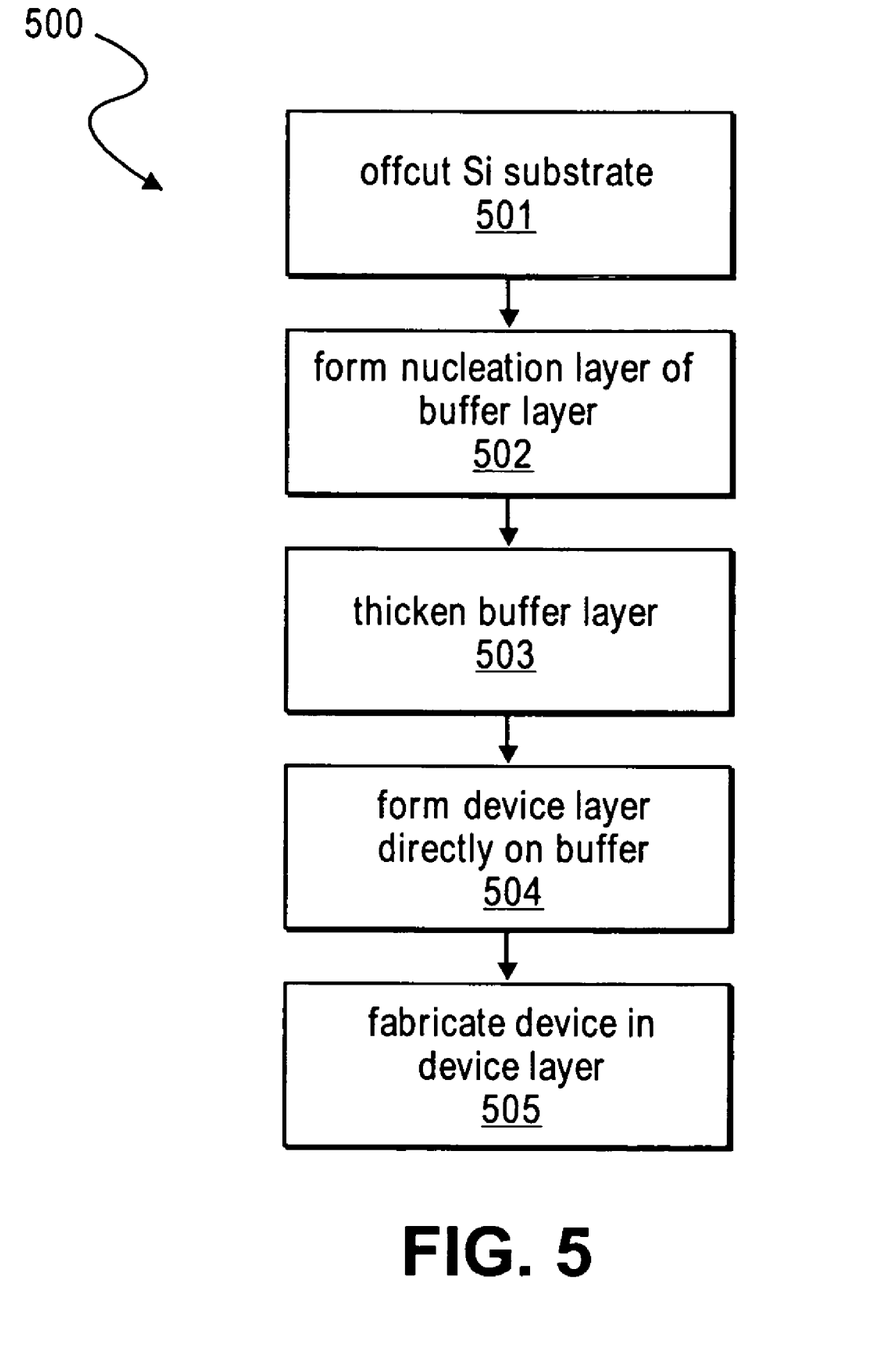
FIG. 5 is a flow diagram of a method of fabricating a group III-V semiconductor device layer upon a silicon substrate in accordance with the present invention.

FIG. 5 is a flow diagram of a method to fabricate a III-V device layer in accordance with an embodiment of the present invention. Method 500 of FIG. 5 begins with an offcut silicon substrate at step 501. At step 502, a nucleation layer is formed as the initial step of a two step process to form a buffer layer. At step 503, the buffer layer is thickened with a growth process distinct from that used at step 502. In step 504, a III-V device layer is formed directly on the buffer and a device is fabricated in the III-V device layer at step 505. Each of these steps is discussed in greater detail below in reference to FIGS. 3A-3D.

Figure 3A:
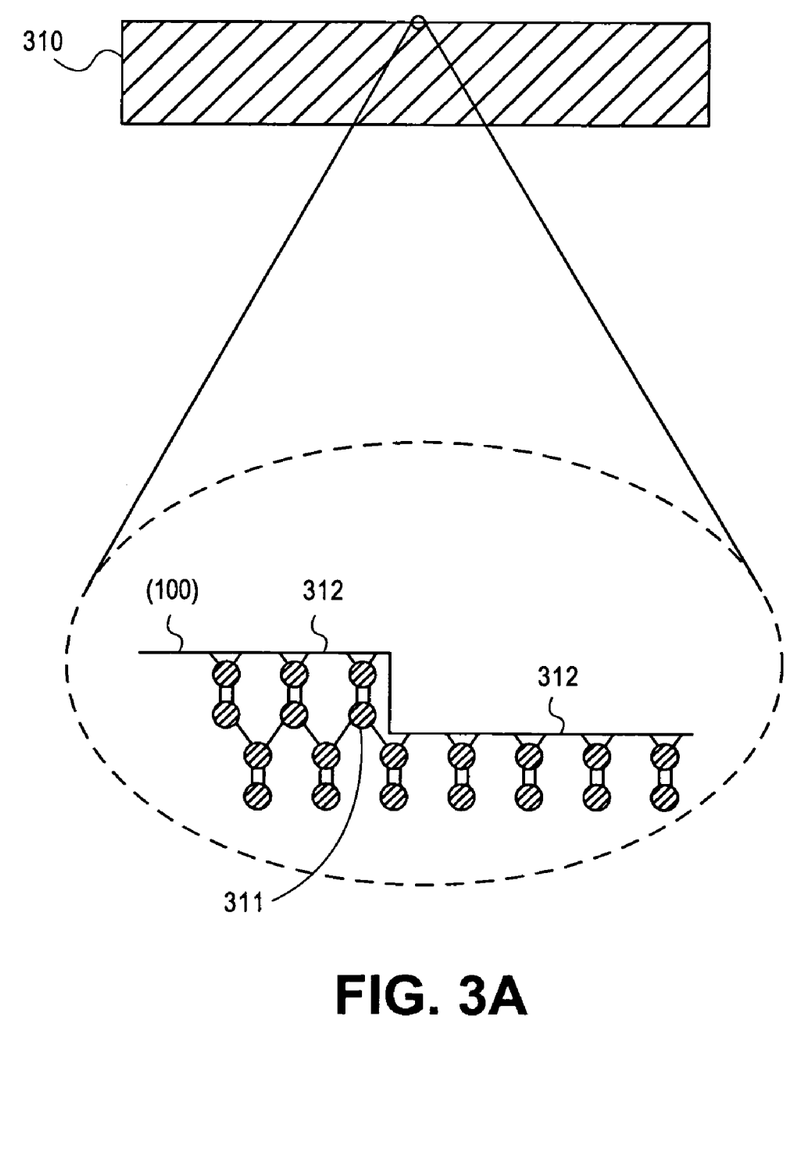
FIGS. 3A-3D are illustrations of cross-sectional views of a method of fabricating a group III-V semiconductor device layer upon a silicon substrate in accordance with the present invention.

Fabrication begins with silicon substrate 310. In a particular embodiment, substrate 310 has a vicinal surface, as shown in FIG. 3A. A vicinal surface is prepared by off-cutting the substrate from an ingot. In one such embodiment, the ingot is grown to provide wafer slices having (100) surfaces. The (100) substrate surface is then offcut at an angle between 2 and 12 degrees towards the [110] direction to produce a surface having terraces 312. Terraces 312 include a surface having a (100) crystal plane. The (100) plane surface area of each terrace 312 depends on the specific offcut angle, with a greater angle producing a greater number of terraces, each terrace having lesser (100) surface area. In such embodiments, the offcut produces a vicinal surface having an array of (100) terraces, many of which are separated by a double atomic step. As shown in the expanded view of FIG. 3A, a double step terrace has a height of two silicon atoms 311. In another embodiment, the silicon substrate offcut orientations are (211), (511), (013), (711) and other high index planes. Optionally, silicon substrate 310 is without an offcut (zero degree offcut), such as, but not limited to, common (100) substrates. Such a substrate (not pictured) typically does not have a substantial number of double atomic step terraces.

Next, the III-V buffer layer is formed upon the silicon substrate 310. Commonly known growth techniques may be used to form the III-V buffer layer, such as, but not limited to, metalorganic chemical vapor deposition (MOCVD) or molecular beam epitaxy (MBE). As previously discussed, in particular embodiments, the buffer is formed in a manner that either avoids the formation of anti-phase domains (APD) or annihilates them as the film thickness is increased.

Figure 3B:
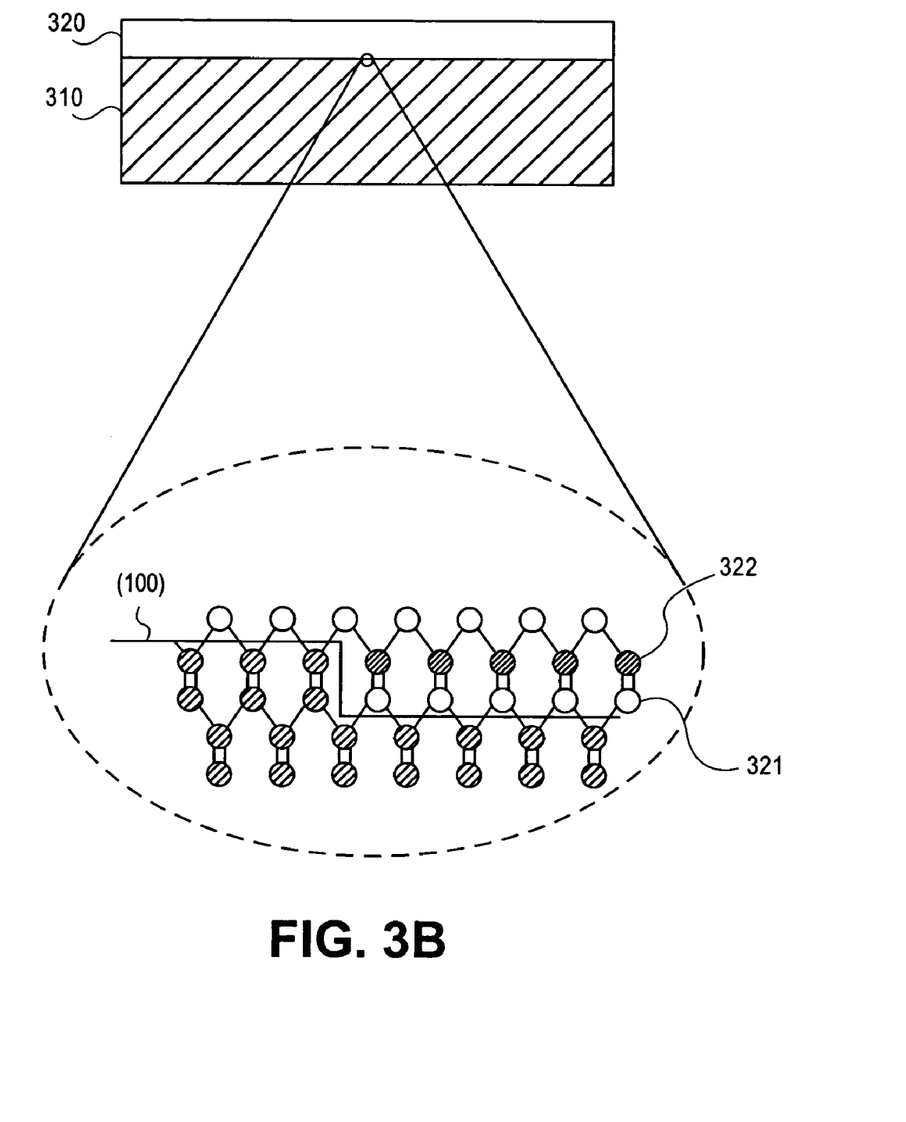
Figure 3C:
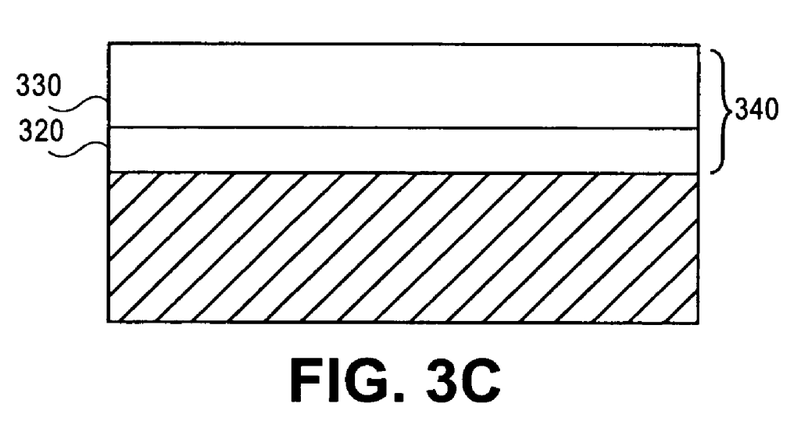

In a particular embodiment, as shown in FIG. 3B and FIG. 3C, the III-V buffer layer 340 is formed using a two step process, wherein the growth conditions of each step are distinct. In the first step, as shown in FIG. 3B, a nucleation layer 320 is formed. The growth of nucleation layer 320, as shown in the expanded view, successively fills the lowest silicon substrate terraces with atomic bi-layers of the III-V semiconductor buffer material. In this embodiment, the mobility of both the group III and group V species of the nucleation layer 320 are sufficiently high that the atomic species introduced to the silicon surface travel about the surface of silicon substrate 310 and either fall into a terrace or completely off the silicon substrate surface. A species which falls down a terrace wall lacks the energy to scale back up the terrace wall, therefore the otherwise substantially random species motion can be effectively funneled in a direction dictated by the substrate terracing. Once the species reaches the lowest terrace, the silicon substrate bonding sites are located by the mobile species until every site is filled. Because of the double atomic step in the silicon substrate 310, a terrace completely filled with species 321 presents a single atomic step which the mobile species is unable to scale, and so excess species travel off the substrate surface without a significant number bonding to sites in the upper terrace levels. Subsequent introduction of the second species of the polar atomic pair is similarly funneled to the lowest terrace to bond with the first atomic species 321 to completely fill the lowest terrace with species 322. The growth process then proceeds in this iterative fashion until all terraces are filled and no nonpolar silicon substrate surface remains, at which point there is no longer risk of forming an APD in the polar buffer materials. Thus, depending on the offcut angle of the substrate, the number of terraces which must be successively filled varies. As the offcut angle increases, the number of terrace levels increases and the thickness of the nucleation layer must be increased to fill every terrace. In particular embodiments, therefore, the nucleation layer 320 is between approximately 50Å and approximately 500Å. In some embodiments, the nucleation layer 320 is between approximately 30Å and approximately 300Å.

The high mobility required to ensure the terraces are successively filled is provided for by the growth parameters of the nucleation layer 320 and these parameters therefore depend on the particular mobility characteristics of species comprising the material of layer 320. For example, in one embodiment, a nucleation layer 320 is formed using migration enhanced epitaxy (MEE) at a temperature of between 300 C and 600 C. MEE proceeds in a fashion similar to that of atomic layer deposition (ALD). MEE has a relatively slower growth rate, approximately 0.1 um/hr, because once the group V element is introduced to the substrate there is a hold time during which both the group V source and group III source shutters are closed (shuttered). This hold time accommodates the relatively lower mobility of the group V species. No hold time is required for group III species because surface migration of this species relatively higher mobility. In a particular MEE embodiment, the substrate surface is exposed to an antimony (Sb) source for approximately 10 seconds to form a monolayer of Sb on the lowest terrace level. The Sb source and is then shuttered for a hold time of approximately 60 seconds. This relatively long hold time allows for the Sb species to migrate on the surface of the silicon substrate to ensure the bonding sites of the lowest terrace level are filled. Then, the substrate surface is exposed to a gallium (Ga) source for approximately 10 seconds. No hold time is required because of the high surface mobility of Ga. Next, the Sb is reopened for approximately 10 second and then again closed for a hold time. This process is repeated to form a GaSb nucleation layer 320 sufficiently thick to fill all the terraces of the silicon substrate 310, approximately 150Å in a particular embodiment. In an embodiment, GaSb nucleation temperatures are in between 300 C and 600 C. In particular GaSb embodiment, the MEE growth temperature is between approximately 400 C and approximately 510 C. Higher temperature embodiments enable a higher quality film. In other embodiments, MEE can be utilized to form a nucleation layer of an alternate buffer material, such as, but not limited to GaAs.

In yet another embodiment, a nucleation layer 320 is formed on the vicinal silicon substrate 310 utilizing traditional MBE (without migration enhancement). The relatively higher flux of this particular embodiment using traditional MBE provides higher film growth rates and therefore higher throughput than MEE embodiments. In a particular MBE nucleation embodiment, GaSb is formed on the silicon substrate 310 at a temperature between approximately 400 C and approximately 510 C. The high-flux embodiments are well suited to GaSb because of the relatively low vapor pressure and high sticking coefficient of antimony (Sb) as compared to arsenic (As) of GaAs films.

Next, as shown in FIG. 3C, a second growth step completes the formation of the III-V buffer layer 340. This second growth step, performed at a higher temperature than that used for the nucleation layer 320, forms layer 330 to thicken the III-V buffer layer 340 and glide dislocations. The film quality of layer 330 is superior to that of the nucleation layer 320 because it is formed at a higher growth temperature. Also, during the formation of layer 330, the flux rate can be relatively high because the polar nucleation layer 320 eliminates any danger of APD formation. In an embodiment, a GaSb film 330 is grown upon a GaSb nucleation layer 320 at a growth temperature in the range of 500 C and 700 C. In a particular embodiment, a GaSb film 330 is grown upon a GaSb nucleation layer 320 at a growth temperature between approximately 510 C and approximately 570 C. In some embodiments of the present invention, the GaSb film 330 is grown to a thickness between approximately 0.3 um and 5.0 um. In an alternate embodiment, a GaAs film 330 is grown in a similar fashion upon a GaAs nucleation layer 320.

In other embodiments of the present invention, it is preferred to have a thin buffer layer 340. In some embodiments, a thin buffer layer 340 may function as a wetting layer, being only as thick as needed to bridge the non-polar/polar interface between the substrate 310 and buffer layer 340, as well as avoid the formation of anti-phase domains. Because the buffer layer 340 is thin, it is less efficient at transferring strain into a subsequently deposited layer than a thick buffer layer 340 may be. In one particular embodiment, the GaSb film 330 is grown to a maximum thickness of 0.3 um. In yet another embodiment, the GaSb film 330 is grown to a maximum thickness of 0.1 um. In some embodiments it is desirable to have the entire GaSb buffer layer 340, including nucleation layer 320 and layer 330, below approximately 0.1 um.

In still another embodiment, the III-V buffer layer 340 is formed on a traditional silicon substrate 310 having a lower order plane surface, such as, but not limited to (100). The III-V buffer layer 340 is grown without a nucleation step and permitted to form anti-phase domains. In an embodiment, the single-step growth is performed at a temperature between 500 C and 700 C. Once the film thickness is greater than approximately 1.5 um, the anti-phase domains, along with the stacking faults and twins, are substantially annihilated and the film becomes single-domain. In a particular embodiment, a III-V buffer layer 340 comprising between approximately 1.5 and 2.0 um GaSb is formed on a traditional (100) silicon substrate 310 that has a 0 degree offcut.

Figure 3D:
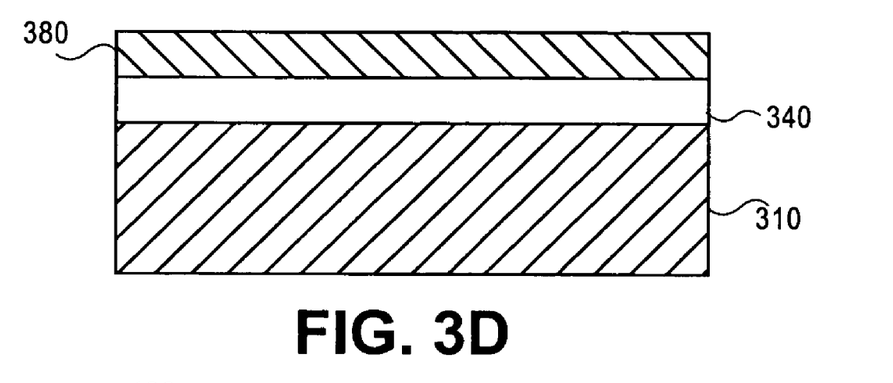

Finally, with the completion of the buffer 340, device layer 380 is formed, as shown in FIG. 3D. Device layer 380 is grown at a temperature appropriate for the particular III-V material desired. In a particular embodiment, wherein buffer layer 340 comprises GaSb, an InSb device layer 380 is formed at a growth temperature between approximately 350 C and approximately 475 C. Depending on the amount of lattice mismatch between the buffer 340 and the III-V device layer 380, as well as the ability for the device layer to glide dislocations, the device layer 380 is grown to a thickness sufficient to give an acceptable defect density. In a particular embodiment, an InSb device layer 380 is grown to a thickness greater than approximately 2 um. In a further embodiment, an InSb device layer 380 is grown to a thickness of approximately 8 um to achieve a defect density of approximately $4\times10^7$ cm$^{-2}$.

In a particular embodiment, the device layer 380 may have a larger lattice constant material than the buffer layer 340. For example, wherein buffer layer 340 comprises GaSb with a lattice constant of approximately 6.09Å, the device layer 380 may comprise InSb, which has a lattice constant of approximately 6.48Å. In such an embodiment, the GaSb buffer layer 340 may induce a compressive stress into the larger lattice constant InSb device layer 380. The larger lattice constant InSb device layer 380 will retain the strain up until the device layer 380 reaches its critical thickness. Beyond the critical thickness, a lattice mismatched layer will relax, thus reducing strain. In one embodiment, an InSb device layer 380 grown at less than 410 C will have a critical thickness of approximately 100Å.

In another embodiment, the device layer 380 may have a smaller lattice constant than the buffer layer 340. For example, wherein the buffer layer 340 comprises GaSb with a lattice constant of approximately 6.09Å, the device layer 380 may be comprised of a smaller lattice constant material such as $In_xGa_{1-x}As$ (x~0.7, ~5.9Å), InAs (6.06Å), or InP (5.87 Å). In such an embodiment, a strained device layer 380 may be detrimental to device performance. For example, a tensilely strained device layer 380 may be prone to cracking, thus introducing detrimental defects. In an embodiment, where the device layer 380 has a smaller lattice constant than the buffer layer 340, the buffer layer 340 may have a maximum thickness of less than approximately 0.3 um in order to reduce the amount of strain being induced in the device layer 380.

Figure 4A:
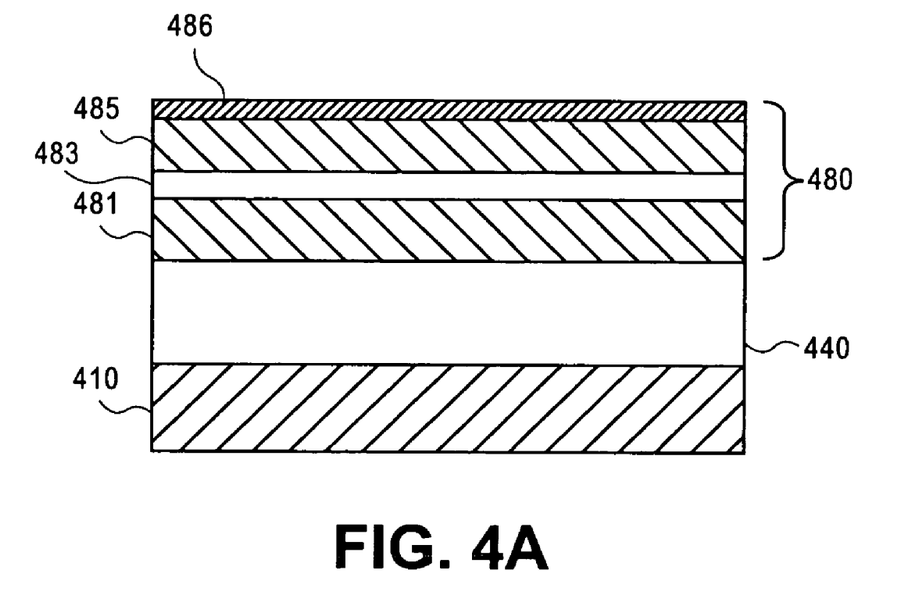
FIGS. 4A-4C are illustrations of cross-sectional views of a method of fabricating a quantum well (QW) transistor in accordance with the present invention.
Figure 4B:
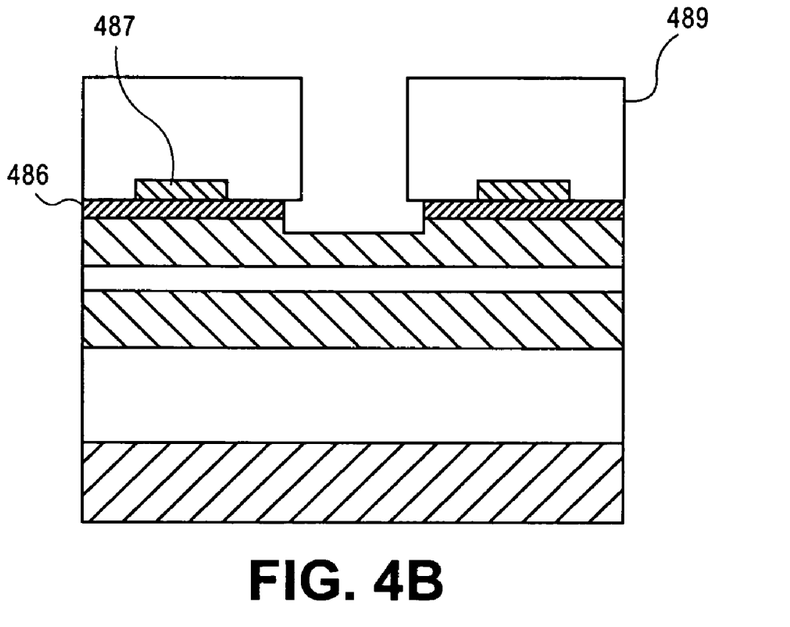
Figure 4C:
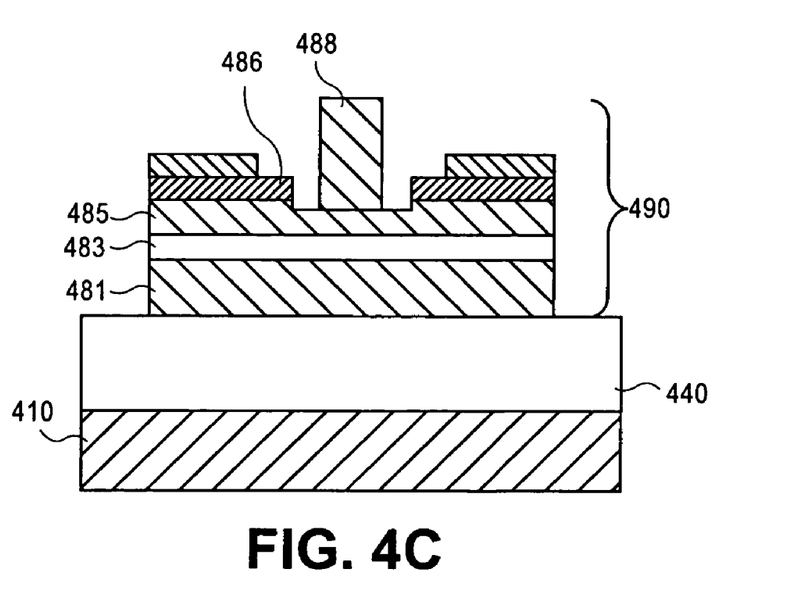

FIGS. 4A-4C depict embodiments of methods to fabricate a quantum well transistor in a III-V device layer on a substrate incorporating embodiments of the III-V buffer architecture discussed. FIG. 4A shows device layer 480 comprising a quantum well 483 between an upper barrier layer 485 and a lower barrier layer 481 formed upon the buffer 440 over silicon substrate 410.

Generally, the lower barrier layer 481 is formed of a higher band gap material than the overlying quantum well 483. The lower barrier layer 481 is of sufficient thickness to provide a potential barrier to charge carriers in the transistor channel. In a particular embodiment, the lower barrier layer thickness is between about 100Å and about 250 Å. In other embodiments, the lower barrier is InAlSb between 2500Å and 3000Å thick. In still other embodiments, lower barrier layer 481 is microns thick to further reduce defect density in the quantum well 483. In certain embodiments wherein the buffer 440 is comprised of a GaSb, the lower barrier layer 481 is comprised of aluminum indium antimonide ($Al_xIn_{1-x}Sb$). In a particular embodiment, the lower barrier layer 481 is $Al_xIn_{1-x}Sb$ with 15% aluminum. In certain other embodiments wherein the buffer 440 comprises GaAs, the lower barrier layer 481 is comprised of indium aluminum arsenide (InAlAs).

Then, over the lower barrier layer 481, a quantum well 483 is formed of a material with a smaller band gap than that of the lower barrier. In an embodiment wherein the buffer 440 comprises GaSb, the quantum well 483 is doped or undoped and formed of InSb. In another embodiment wherein the buffer 440 comprises GaAs, the quantum well 483 is doped or undoped and formed of indium gallium arsenide ($In_xGa_{1-x}As$) or InAs, as two examples. Quantum well 483 is of a sufficient thickness to provide adequate channel conductance. In certain embodiments, the thickness of the quantum well 483 is between about 50Å and about 300Å.

Over the quantum well 483 is the upper barrier layer 485. Upper barrier layer 485 has a larger band gap than the quantum well 483, thereby confining a majority of charge carriers within the quantum well 483 for reduced device leakage. The upper barrier layer 485 may be formed of the same or different materials as the lower barrier layer 481. In certain embodiments wherein the buffer 440 comprises GaSb, the upper barrier layer 485 comprises aluminum indium antimonide ($Al_xIn_{1-x}Sb$). In a particular embodiment, the upper barrier layer 485 is $Al_xIn_{1-x}Sb$ with 15% aluminum. In certain other embodiments, wherein the buffer 440 comprises GaAs, the upper barrier layer 485 comprises indium aluminum arsenide (InAlAs). The upper barrier layer 485 may include a delta-doped layer (not shown) to supply carriers for embodiments where the lower quantum well is undoped (optionally the lower barrier 481 may be similarly doped to supply carriers). For an n-type device utilizing an $Al_xIn_{1-x}Sb$ upper barrier 485, the delta doping may be done using silicon (Si) or tellurium (Te) impurities, as two examples. The upper barrier layer 485 may have various thicknesses and in certain embodiments the upper barrier layer 485 is between about 40Å and 400Å thick.

Finally, to complete device layer 480 as shown in FIG. 4A, a highly-doped source drain layer 486 is formed above the upper barrier layer 485. In a particular embodiment, the source drain layer 486 is n+ doped InSb between about 30Å to about 300Å thick.

As shown in FIG. 4B, source and drain contact metallizations 487 are then formed by commonly known deposition processes, such as electron beam evaporation or reactive sputtering. In various embodiments, as shown in FIG. 4B, a mask material 489 is used to selectively remove a portion of the semiconductor device stack in preparation for the placement of the gate electrode. Depending on whether a depletion mode or enhancement mode device is desired, selective etches may be used to form a recess having a particular depth. In particular embodiments, source drain layer 486 is removed during the gate recess etch to expose a suitable Schottky surface on the upper barrier layer 485. Commonly known dry or wet etch techniques may be utilized to form the gate recess. The etchant may be selective to the composition of the semiconductor, for example, in an embodiment, an n+ doped indium antimonide (InSb) source drain layer 486 is selectively removed using a wet etch process comprised of citric acid and peroxide. Through application of similar commonly known selective etch techniques, the recess etch depth may be tightly controlled by terminating on a stop layer grown upon the upper barrier layer 485 (not shown).

As shown in FIG. 4C, the gate electrode 488 is formed over the upper barrier layer 485. In some embodiments of the present invention, commonly known techniques are used to form the gate electrode 488 directly on the upper barrier layer 485, thereby creating Schottky junction through which the gate controls the quantum well 483. In other embodiments, commonly known techniques are used to form the gate electrode 488 on a dielectric layer over the upper barrier layer 485, thereby creating a MOS junction. In particular embodiments, the gate electrode 488 is formed using commonly known lift-off methods relying on lithography and highly directional deposition techniques, such as electron beam deposition, to separate the gate electrode 488 from the source drain layer 486.

Then, as shown in FIG. 4C, the quantum well transistor 490 is isolated using commonly known techniques. In particular embodiments, the epitaxial device layer of the quantum well transistor 490 is etched through to form an active device mesa upon the buffer 440 over silicon substrate 410. The isolation etch removes the source drain layer 486, upper barrier 485, quantum well 483 and lower barrier 481 along a perimeter of the active device to form the mesa. This enables device isolation to be achieved with minimal topography. With the quantum well transistor 490 substantially complete, backend processing is performed using commonly known techniques to connect quantum well transistor 490 to the external environment.

Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A semiconductor structure comprising:
   an offcut silicon substrate including a vicinal surface having an array of terraces;
   a nucleation layer disposed directly on the vicinal surface of the offcut silicon substrate and filling the array of terraces, wherein the nucleation layer consists essentially of a plurality of atomic bi-layers of a monolayer Sb and a monolayer Ga, and bonding sites of the array of terraces are terminated with a monolayer Sb conformal to the vicinal surface;
   a buffer layer consisting essentially of GaSb disposed directly on the nucleation layer; and
   a compound semiconductor device layer having a threading dislocation density of less than $1\times10^8$ $cm^{-2}$ directly on the buffer layer,
   wherein the compound semiconductor device layer has a larger lattice constant or a smaller lattice constant than the buffer layer.

2. The structure of claim 1, wherein the nucleation layer is between about 50 and 300 angstroms thick.

3. The structure of claim 1, wherein the nucleation layer is on a (100) surface of the silicon substrate that is offcut 2 to 12 degrees in a [110] direction.

4. The structure of claim 1, wherein the device layer has a larger lattice constant than the buffer layer.

5. The structure of claim 4, wherein the device layer is under a compressive stress.

6. The structure of claim 4, wherein the buffer layer is approximately 0.3 um to 5.0 um thick.

7. The structure of claim 4, wherein the device layer is a narrow band gap material consisting essentially of InSb.

8. The structure of claim 7, wherein the InSb device layer is approximately 2 to 5 um thick.

9. The structure of claim 1, wherein the device layer has a smaller lattice constant than the buffer layer.

10. The structure of claim 9, wherein the device layer is a narrow band gap material selected from the group consisting of: $In_xGa_{1-x}As$, InAs, and InP, wherein x is between approximately 0.7 and 0.8.

11. The structure of claim 9, wherein the buffer layer is less than approximately 0.3 um thick.

12. The structure of claim 9, wherein the buffer layer is less than approximately 0.1 um thick.

13. The structure of claim 1, wherein the device layer includes a quantum well layer disposed between two barrier layers, wherein the barrier layers have a wider band gap than the quantum well layer.

14. The structure of claim 1, further comprising a device formed in the compound semiconductor device layer, wherein the device is selected from the group consisting of: an electronic device, an optical device, and an electro-optical device.

15. The structure of claim 14, wherein the electronic device formed in the compound semiconductor device layer is a quantum well transistor.

16. The structure of claim 1, wherein the array of terraces are double step terraces having a height of two silicon atoms.

* * * * *

UNITED STATES PATENT AND TRADEMARK OFFICE
CERTIFICATE OF CORRECTION

| | | |
|---|---|---|
| PATENT NO. | : 8,143,646 B2 | Page 1 of 1 |
| APPLICATION NO. | : 11/498901 | |
| DATED | : March 27, 2012 | |
| INVENTOR(S) | : Hudait et al. | |

It is certified that error appears in the above-identified patent and that said Letters Patent is hereby corrected as shown below:

On the Title Page, Item 75, delete, "Clarra" and insert -- Clara --.

Signed and Sealed this
Eighteenth Day of November, 2014

Michelle K. Lee
*Deputy Director of the United States Patent and Trademark Office*